US007859291B2

(12) United States Patent  (10) Patent No.: US 7,859,291 B2
Kim  (45) Date of Patent: Dec. 28, 2010

(54) METHOD OF MEASURING ON-RESISTANCE IN BACKSIDE DRAIN WAFER

(75) Inventor: Yeo-Hwang Kim, Gwanak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/325,168

(22) Filed: Nov. 29, 2008

(65) Prior Publication Data

US 2009/0140763 A1 Jun. 4, 2009

(30) Foreign Application Priority Data

Dec. 3, 2007 (KR) .................... 10-2007-0124462

(51) Int. Cl.
*G01R 31/26* (2006.01)
*H01L 27/088* (2006.01)
(52) U.S. Cl. .................... 324/769; 324/765; 257/48; 438/18
(58) Field of Classification Search ............... 324/769; 438/14–18; 257/48
See application file for complete search history.

(56) References Cited

U.S. PATENT DOCUMENTS

| 7,365,559 | B2* | 4/2008 | Colbeck ................. 324/769 |
| 7,394,276 | B2* | 7/2008 | Gebara et al. ........... 324/765 |
| 7,615,991 | B2* | 11/2009 | Jang ..................... 324/158.1 |
| 2009/0256149 | A1* | 10/2009 | Ho et al. ............... 257/48 |
| 2009/0309097 | A1* | 12/2009 | Hsieh .................... 257/48 |

* cited by examiner

*Primary Examiner*—Ha Tran T Nguyen
*Assistant Examiner*—Emily Y Chan
(74) *Attorney, Agent, or Firm*—Sherr & Vaughn, PLLC

(57) ABSTRACT

A method of measuring on-resistance in a backside drain wafer includes providing a wafer having a first MOS transistor and a second MOS transistor each having a source and also sharing a drain provided at a backside of the wafer, and then forming a current flow path passing through the first and second MOS transistors, and then measuring a resistance between the sources of the first and second MOS transistors. Accordingly, an on-resistance in a backside drain wafer can be measured without using a chuck.

12 Claims, 3 Drawing Sheets

METHOD OF MEASURING ON-RESISTANCE IN BACKSIDE DRAIN WAFER

The present application claims priority under 35 U.S.C. §119 to Korean Patent Application No. 10-2007-124462 (filed on Dec. 3, 2007), which is hereby incorporated by reference in its entirety.

BACKGROUND

Generally, in a MOS transistor configuration, positions and shapes of source, drain and gate vary according to the requirements. The MOS transistor has to maintain an appropriate resistance (Rdson) between drain and source in a turn-on state irrespective of its configuration. After the MOS transistor has been fabricated, a resistance between the source and drain is measured using a probe card while power is applied to a gate of the MOS transistor. This facilitates the measurement if the source and drain are provided at an upper side of the wafer. Yet, if the drain is provided to a bottom or otherwise backside of the wafer, a chuck is separately used to contact the drain.

Figure 1:
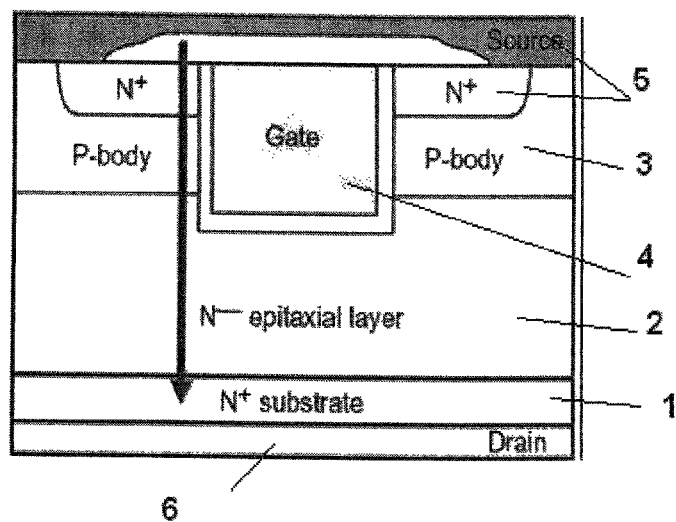
Figure 2:
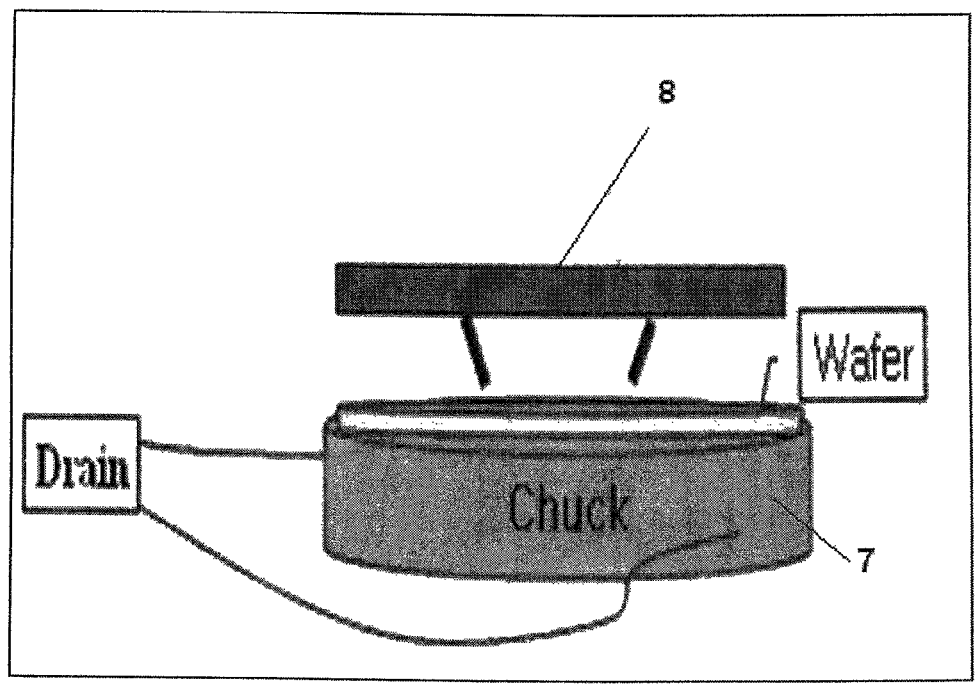
Figure 3:
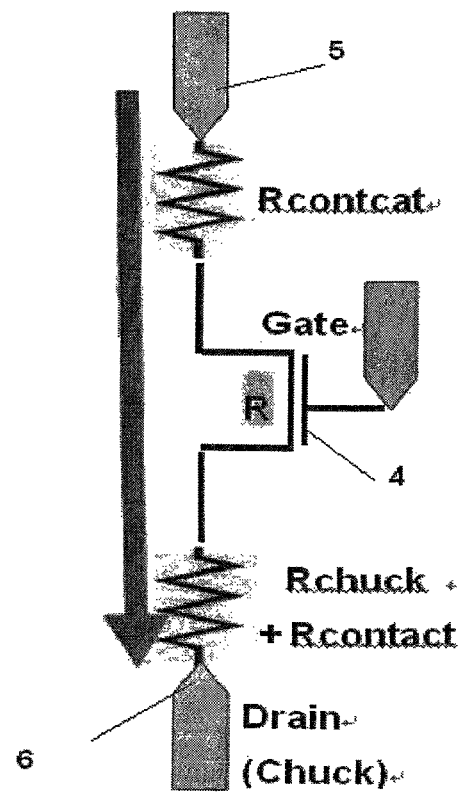

FIGS. 1 to 3 illustrate an on-resistance measuring method in a backside drain wafer according to the related art. Referring to FIG. 1, a unit MOS transistor, of which backside is a drain, includes a lightly doped n-type epitaxial layer 2 formed on and/or over a heavily doped n-type substrate 1, a p-type channel layer 3 formed on and/or over the epitaxial layer 2, a gate 4 embedded in the channel layer 3 and a portion of the epitaxial layer 2, a source provided at an upper peripheral part of the gate 4 and the drain provided at a backside of the substrate 1. If power is applied to the gate 4, a channel is vertically formed to electrically connect the source 5 and the drain 6. Hence, if the transistor is turned on, a vertical current path is generated to electrically connect the source 5 and drain 6.

FIG. 2 is a diagram for configuration of an on-resistance measuring device in backside drain wafer according to a related art and FIG. 3 is an equivalent circuit diagram thereof. Referring to FIGS. 2 and 3, an on-resistance measuring device in a backside drain wafer according to a related art includes a chuck 7 which contacts the drain 6. Resistance between the source 5 and the drain 6 is measured using a probe card 8 connected to the source 5 and the gate 4 while power is applied to the gate 4. In particular, the probe card 8 and the chuck 7, which configure a measuring tool, are connected to both ends of the current path between the source 5 and the drain 6. The drain resistance is then measured using the relation between the corresponding current and voltage.

However, in case of using a metal chuck 7 directly contacting the drain 6, the intrinsic resistance of the chuck 7 and the contact resistance between the drain 6 and the chuck 7 are involved, it is difficult to perform precise measurement. To maximize reliability of the measurement value in the above measurement, the chuck 7 should be formed of a low-resistance material such as Au and the like. Yet, even if the chuck 7 is formed of Au, it is impossible to completely cut off the generation of parasitic resistance. Hence, the measured value becomes erroneous as well as a product cost of the measuring device is raised.

SUMMARY

Embodiments relate to a method of measuring on-resistance in a backside drain wafer without contacting a drain with a metal chuck.

Embodiments relate to a method of measuring on-resistance in a backside drain wafer by which a precise on-resistance can be measured without using a chuck.

Embodiments relate to a method of measuring on-resistance in a backside drain wafer that may include at least one of the following: providing a wafer having a first MOS transistor and a second MOS transistor each having a source and also sharing a drain provided at a backside of the wafer; and then forming a current path passing through the first and second MOS transistors; and then measuring a resistance between the sources of the first and second MOS transistors.

Embodiments relate to a method of measuring on-resistance in a backside drain wafer that may include at least one of the following: providing a first transistor in a substrate including a first gate formed embedded in the substrate, a first source formed over the first gate at an upper portion of the substrate and a common drain formed at a bottom portion of the substrate; and then providing a second transistor in the substrate including a second gate formed embedded in the substrate, a second source formed over the second gate at an upper portion of the substrate and the common drain; and then forming a current path flowing through the first transistor and the second MOS transistor; and measuring a resistance between the first source of the second source.

Embodiments relate to a method that may include at least one of the following: providing a first transistor in a substrate including a first gate formed embedded in the substrate, a first source formed over the first gate at an upper portion of the substrate and a common drain formed at a bottom portion of the substrate; and then providing a second transistor in the substrate including a second gate formed embedded in the substrate, a second source formed over the second gate at an upper portion of the substrate and the common drain; and then simultaneously applying a first voltage to the first gate and a second voltage the second gate; and then measuring a resistance between the first source of the second source.

Embodiments relate to an apparatus that may include at least one of the following: a first transistor formed in a substrate including a first gate formed embedded in the substrate, a first source formed over the first gate at an upper portion of the substrate and a common drain formed at a bottom portion of the substrate; and then a second transistor formed spaced apart from the first transistor including a second gate formed embedded in the substrate, a second source formed over the second gate at an upper portion of the substrate and the common drain.

In accordance with embodiments, a method of measuring an on-resistance in a backside drain wafer may include at least one of the following: forming a current path passing through first and second MOS transistors sharing a drain provided to a backside of the wafer and measuring a resistance between sources of the first and second MOS transistors. In accordance with embodiments, the current path is formed in a manner that voltages are respectively applied to gates of the first and second MOS transistors to enable a current through the common drain via a channel from the source of the first MOS transistor to pass through the source of the second MOS transistor via a channel of the second MOS transistor. In accordance with embodiments, the voltages respectively applied to the gates of the first and second MOS transistors are test voltages equal to each other. In accordance with embodiments, when the same test voltages are applied to the gates of the first and second MOS transistors, the resistance between the sources of the first and second MOS transistors is an on-resistance sum. In accordance with embodiments, the voltages respectively applied to the gates of the first and second MOS transistors are a test voltage and a floating voltage, respectively. In accordance with embodiments, when the test voltage and the floating voltage are applied to the gates of the first and second MOS transistors, respectively, the on-resistance of the first MOS transistor is calculated by subtracting a resistance component of the second MOS transistor from the measured resistance between the sources of the first and second MOS transistors. In accordance with embodiments, because on-resistance in a backside drain wafer can be measured without using a chuck, test reliability can be maximized. Overall costs are lowered by not using an expensive chuck.

DRAWINGS

FIGS. 1 to 3 illustrate a unit MOS transistor of which backside is a drain and configurations of an on-resistance measuring device in backside drain wafer.

Figure 4:
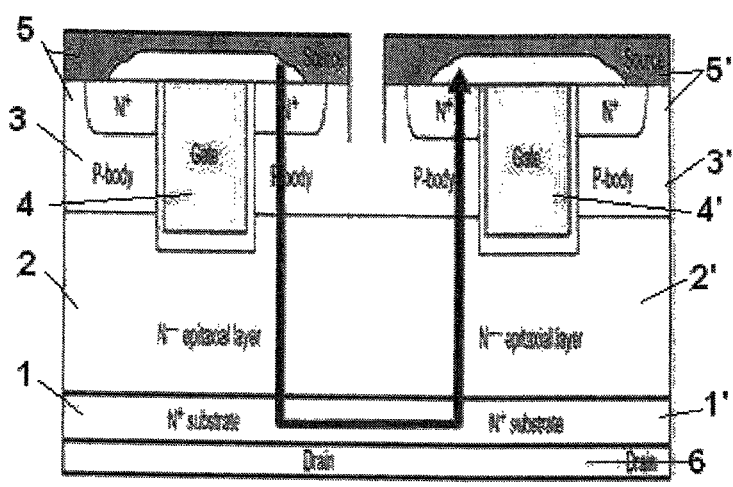
Figure 5:
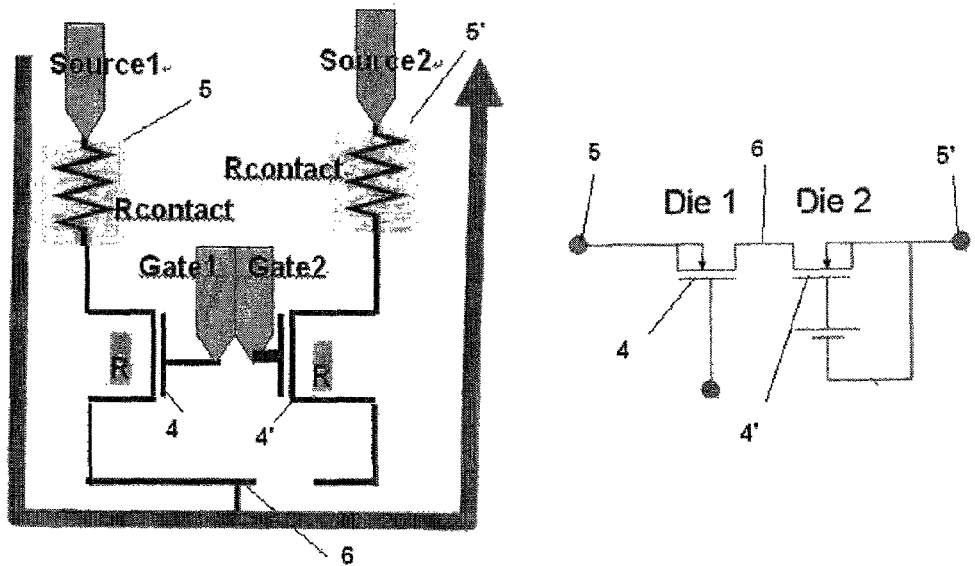
Figure 6:
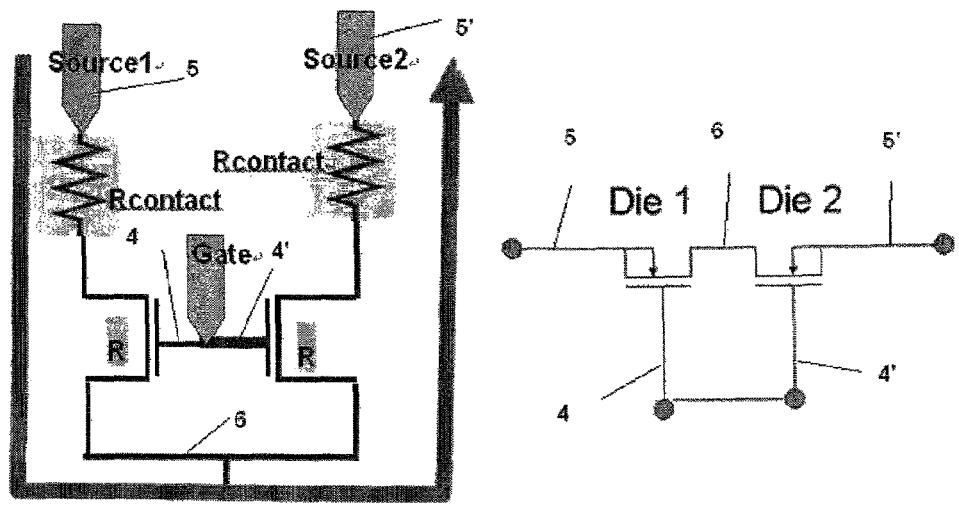

Example FIGS. 4 to 6 illustrate a MOS transistor having a backside drain and circuit diagrams in accordance with embodiments.

DESCRIPTION

Example FIG. 4 is a cross-sectional diagram of a first MOS transistor (Die 1) for explaining a method of measuring an on-resistance in a backside drain wafer and example FIG. 5 is a diagram of an equivalent circuit shown in example FIG. 4. Referring to example FIGS. 4 and 5, in a structure including a first MOS transistor having lightly doped n-type epitaxial layer 2 formed on and/or over heavily doped n-type substrate 1. P-type channel layer 3 is formed on and/or over epitaxial layer 2 and gate 4 embedded in channel layer 3 and partially in epitaxial layer 2. Source 5 is formed on and/or over gate 4 and drain 6 formed at a bottom region or backside of substrate 1. Second MOS transistor (Die 2) is provided adjacent to first MOS transistor (Die 1). Second MOS transistor (Die 2) has lightly doped n-type epitaxial layer 2' formed on and/or over a heavily doped n-type substrate 1'. P-type channel layer 3' is formed on and/or over epitaxial layer 2' and gate 4' embedded in channel layer 3' and partially in epitaxial layer 2'. Source 5' is formed on and/or over gate 4' and drain 6 formed at a bottom region or backside of substrate 1'.

On-resistance is measured by altering a current path using the fact that drain 6 is shared by first MOS transistor (Die 1) and second MOS transistor (Die 2) on backsides thereof. In particular, when the first MOS transistor (Die 1) and second MOS transistor (Die 2) are turned on by applying power to gates 4 and 4' thereof, respectively, a current path is formed that flows to drain 6 via source 5, channel layer 3, epitaxial layer 2 and substrate 1 of first MOS transistor (Die 1) and then flows to substrate 1', epitaxial layer 2', channel layer 3' and source 5' of second MOS transistor (Die 2). By applying a test voltage to gate 4 of first MOS transistor (Die 1) and applying a voltage over a full turn-on voltage to gate 4' of second MOS transistor (Die 2), gate 4' is forced into a floating mode.

While the above state is maintained, total resistance components of first MOS transistor (Die 1) and second MOS transistor (Die 2) are measured. On-resistance of first MOS transistor (Die 1) is then measured by subtracting the resistance component of second MOS transistor (Die 2) from the measured value. In this case, the measured value of the on-resistance becomes twice the resistance between the source and drain of first MOS transistor (Die 1). Hence, a half of the measured value becomes the on-resistance (Rsdon) of first MOS transistor (Die 1). Thus, by forming the current path via the two MOS transistors sharing a common drain with each other, the resistance of the current path is measured without using a chuck, and thus, the on-resistance can be precisely measured. Therefore, it is able to enhance reliability of measurement by minimizing the generation of parasitic resistances.

Example FIG. 6 is a diagram of an equivalent circuit in accordance with embodiments. Referring to example FIG. 6, the on-resistance of first MOS transistor (Die 1) and second MOS transistors (Die 2) can be simultaneously measured. In particular, the same test voltage is applied to each gate 4 and gate 4'. A resistance value between source 5 and source 5' of the MOS transistors is measured. The resistance measured values correspond to a sum of the resistances of the MOS transistors. In particular, while the same test voltage is applied to gates 4 and gate 4' of first MOS transistor (Die 1) and second MOS transistor (Die 1), a current path flows to reach drain 6 via source 5, channel layer 3, epitaxial layer 2 and substrate 1 of first MOS transistor (Die 1) and then flows to source 5' via substrate 1', epitaxial layer 2' and channel layer 3' of second MOS transistor (Die 2). If resistance between source 5 and source 5' is measured using a probe over the wafer, it is able to measure the on-resistance sum of first MOS transistor (Die 1) and second MOS transistor (Die 2).

Thus, in accordance with embodiments, in measuring an on-resistance in a backside drain wafer, a current path is altered to exclude a parasitic resistance component generated from using a chuck. Therefore, embodiments enable an on-resistance to be more precisely measured. Moreover, since resistance measurement can be performed over a wafer, embodiments enable the corresponding measurement using a general resistance measuring device only.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

providing a wafer having a first MOS transistor and a second MOS transistor each having a source and also sharing a drain provided at a backside of the wafer; and then forming a current flow path by applying a voltage to gates of the first and second MOS transistors to enable current flow through the drain via a channel from the source of the first MOS transistor to pass through the source of the second MOS transistor via a channel of the second MOS transistor; and then measuring a resistance between the sources of the first and second MOS transistors, wherein the voltage to the gate of the first MOS transistor is a first test voltage and the voltage applied to the gate of the second MOS transistor is a second test voltage, and wherein the first test voltage is equal to the second test voltage.

2. The method of claim 1, wherein the resistance between the sources of the first and second MOS transistors is an on-resistance sum.

3. The method of claim 1, wherein the voltage to the gate of the first MOS transistor is a test voltage and the voltage applied to the gate of the second MOS transistor is a floating voltage.

4. The method of claim 3, wherein the on-resistance of the first MOS transistor is calculated by subtracting a resistance component of the second MOS transistor from the measured resistance between the sources of the first and second MOS transistors.

5. A method comprising:
providing a first transistor in a substrate including a first gate formed embedded in the substrate, a first source formed over the first gate at an upper portion of the substrate and a common drain formed at a bottom portion of the substrate; and then
providing a second transistor in the substrate including a second gate formed embedded in the substrate, a second source formed over the second gate at an upper portion of the substrate and the common drain; and then
simultaneously applying a first voltage to the first gate and a second voltage the second gate; and then
measuring a resistance between the first source of the second source.

6. The method of claim 5, wherein simultaneously applying the first voltage and the second voltage comprises forming a current flow path through the first transistor and the second MOS transistor.

7. The method of claim 5, wherein the first voltage is a first test voltage and the second voltage is a second test voltage.

8. The method of claim 7, wherein the first test voltage is equal to the second test voltage.

9. The method of claim 5, wherein the first voltage a test voltage and the second voltage is a floating voltage.

10. The method of claim 5, wherein the resistance between the first source and the second source is an on-resistance sum.

11. The method of claim 10, wherein the on-resistance of the first transistor is calculated by subtracting a resistance component of the second transistor from the measured resistance between the first source and the second source.

12. The method of claim 5, wherein the first and second transistors comprise MOS transistors.

* * * * *